United States Patent
Shigaki et al.

(10) Patent No.: US 11,531,269 B2
(45) Date of Patent: Dec. 20, 2022

(54) METHOD FOR PRODUCING RESIST PATTERN COATING COMPOSITION WITH USE OF SOLVENT REPLACEMENT METHOD

(71) Applicant: NISSAN CHEMICAL CORPORATION, Tokyo (JP)

(72) Inventors: Shuhei Shigaki, Toyama (JP); Satoshi Takeda, Toyama (JP); Wataru Shibayama, Toyama (JP); Makoto Nakajima, Toyama (JP); Rikimaru Sakamoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 367 days.

(21) Appl. No.: 16/339,555

(22) PCT Filed: Oct. 2, 2017

(86) PCT No.: PCT/JP2017/035832
§ 371 (c)(1),
(2) Date: Apr. 4, 2019

(87) PCT Pub. No.: WO2018/066517
PCT Pub. Date: Apr. 12, 2018

(65) Prior Publication Data
US 2019/0250512 A1   Aug. 15, 2019

(30) Foreign Application Priority Data
Oct. 4, 2016   (JP) .............................. JP2016-196748

(51) Int. Cl.
| | |
|---|---|
| *H01L 21/027* | (2006.01) |
| *G03F 7/11* | (2006.01) |
| *G03F 7/40* | (2006.01) |
| *G03F 7/20* | (2006.01) |
| *H01L 21/033* | (2006.01) |
| *H01L 21/02* | (2006.01) |
| *C09D 183/04* | (2006.01) |
| *C08G 77/18* | (2006.01) |
| *C08G 77/24* | (2006.01) |
| *C08G 77/20* | (2006.01) |
| *G03F 7/075* | (2006.01) |
| *H01L 21/311* | (2006.01) |

(52) U.S. Cl.
CPC .............. *G03F 7/11* (2013.01); *C08G 77/18* (2013.01); *C08G 77/20* (2013.01); *C08G 77/24* (2013.01); *C09D 183/04* (2013.01); *G03F 7/0757* (2013.01); *G03F 7/20* (2013.01); *G03F 7/2002* (2013.01); *G03F 7/40* (2013.01); *H01L 21/027* (2013.01); *H01L 21/02126* (2013.01); *H01L 21/02216* (2013.01); *H01L 21/02282* (2013.01); *H01L 21/0332* (2013.01); *H01L 21/31116* (2013.01); *H01L 21/31138* (2013.01)

(58) Field of Classification Search
CPC ...... C07F 7/025; C07F 7/1804; C09D 183/00; C08G 77/32; G03F 7/11; H01L 21/027
See application file for complete search history.

(56) References Cited

U.S. PATENT DOCUMENTS

| | | | |
|---|---|---|---|
| 5,262,283 | A | 11/1993 | Sezi et al. |
| 2005/0214695 | A1 | 9/2005 | Kato et al. |
| 2012/0045899 | A1* | 2/2012 | Maruyama ................ G03F 7/40 438/694 |

FOREIGN PATENT DOCUMENTS

| | | | |
|---|---|---|---|
| GB | 2187747 | * | 9/1987 |
| JP | H07-50286 A | | 2/1995 |
| JP | 2005-277052 A | | 10/2005 |
| JP | 2011-027980 A | | 2/2011 |
| WO | 2010/123032 A1 | | 10/2010 |
| WO | 2012/128251 A1 | | 9/2012 |
| WO | 2015/025665 A1 | | 2/2015 |
| WO | 2015/129405 A1 | | 9/2015 |
| WO | 2016/031563 A1 | | 3/2016 |

OTHER PUBLICATIONS

Dec. 5, 2017 International Search Report issued in International Patent Application PCT/JP2017/035832.
Dec. 5, 2017 Written Opinion issued in International Patent Application PCT/JP2017/035832.
Apr. 13, 2022 Notice of Reasons for Refusal issued in Japanese Patent Application No. 2018-543895.

* cited by examiner

*Primary Examiner* — Kuo Liang Peng
(74) *Attorney, Agent, or Firm* — Oliff PLC

(57) ABSTRACT

Method for producing coating composition applied to patterned resist film in lithography process for solvent development to reverse pattern. The method including: step obtaining hydrolysis condensation product by hydrolyzing and condensing hydrolyzable silane in non-alcoholic hydrophilic solvent; step of solvent replacement wherein non-alcoholic hydrophilic solvent replaced with hydrophobic solvent for hydrolysis condensation product. Method for producing semiconductor device, including: step of applying resist composition to substrate and forming resist film; step of exposing and developing formed resist film; step applying composition obtained by above production method to patterned resist film obtained during or after development in step, forming coating film between patterns; step of removing patterned resist film by etching and reversing patterns. Production method that exposure is performed using ArF laser (with wavelength of 193 nm) or EUV (with wavelength of 13.5 nm). Production method that development is negative development with organic solvent.

12 Claims, 4 Drawing Sheets

METHOD FOR PRODUCING RESIST PATTERN COATING COMPOSITION WITH USE OF SOLVENT REPLACEMENT METHOD

TECHNICAL FIELD

The present invention relates to a technology in which, in a lithography process, a coating composition containing a polysiloxane is applied to a patterned resist film that is being formed while a resist film is developed or a patterned resist film after development, the resist film is removed by etching such as dry etching after the composition is filled between patterns, and the pattern is reversed. In addition, the present invention relates to such a coating composition and a method for producing the same.

BACKGROUND ART

A phenomenon in which, in a development step performed after a resist is exposed in a lithography step due to refinement of patterns, or in a rinsing step of a developing solution, the resist pattern collapses causes a problem.

Collapse of patterns is thought to be caused due to a force applied between patterns due to surface tension when a developing solution or a rinsing solution is dried or a force due to a flow of a liquid, that is, a Laplace force. In addition, it is thought that, even when a developing solution or a rinsing solution is blown to the outside using a centrifugal force, a Laplace force may be generated and the patterns may collapse. In order to solve such a problem, a method for forming patterns characterized by including a step of forming a resist film on a substrate, a step of selectively emitting an energy beam to the resist film in order to form a latent image on the resist film, a step of supplying a developing solution (alkaline developing solution) to the resist film in order to form a resist pattern from the resist film on which the latent image is formed, a step of supplying a rinsing solution to the substrate in order to replace the developing solution on the substrate with the rinsing solution, a step of supplying a material for the coating film to the substrate in order to replace at least a part of the rinsing solution on the substrate with the material for the coating film including a solvent and a solute different from that of the resist film, a step of volatilizing the solvent in the material for the coating film in order to form a coating film covering the resist film on the substrate, a step of retracting at least a part of the surface of the coating film in order to expose at least a part of the upper surface of the resist pattern and form a mask pattern composed of the coating film, and a step of processing the substrate using the mask pattern has been disclosed (refer to Patent Literature 1).

In addition, a method for producing a resist structure characterized in that an exposed photoresist layer is treated with a multifunctional amino or hydroxysiloxane aqueous solution or an aqueous alcoholic solution, and is etched in an oxygen-containing plasma has been disclosed (refer to Patent Literature 2).

In addition, a method for forming patterns in which, after resist patterns using a resist material including a base generating agent are formed, a silicon-containing material is applied, and a crosslinked part and an uncrosslinked part of the silicon-containing material are formed, and the uncrosslinked part is removed has been disclosed (refer to Patent Literature 3). A hydroxyl group-containing organic group is used for the silicon-containing material.

In addition, methods of covering gaps between resist patterns with a developing solution containing a polysiloxane have been disclosed (refer to Patent Literature 4, 5, and 6).

PRIOR ART LITERATURES

Patent Literature

[Patent Literature 1] Japanese Patent Application Publication No. 2005-277052
[Patent Literature 2] Japanese Patent Application Publication No. 7-50286
[Patent Literature 3] Japanese Patent Application Publication No. 2011-027980
[Patent Literature 4] WO 2012/128251
[Patent Literature 5] WO 2015/025665
[Patent Literature 6] WO 2015/129405

SUMMARY OF THE INVENTION

Problems to be Solved by the Invention

However, in the method described in Patent Literature 1, due to filling a gap between resist patterns using a water-soluble silicone, when a solvent development process is applied, there is a possibility of filling defects and dissolution of a resist pattern as in Patent Literature 2.

In addition, in the method described in Patent Literature 2, since filling with a silicon-containing composition is performed at the same time as when resist patterns are formed in development and rinsing steps, it is possible to prevent collapse of patterns. However, since water or water and 2-propanol are used as a solvent for the silicon-containing composition, it is not mixed with a developing solution for general solvent development, and there is a risk of filling defects occurring. In addition, even if filling is able to be performed, since 2-propanol dissolves resist patterns for solvent development, this is not able to be applied to a photoresist for solvent development.

In addition, in the method in Patent Literature 3, since a developing solution and a rinsing solution are dried and resist patterns are formed after the development and rinsing steps, when the size of the resist pattern is small, there is a possibility of a problem that resist patterns collapse.

An object of the present invention is to provide a hydrolysis condensation product (polysiloxane) composition of a hydrolyzable silane that can be used in a solvent development process using a photoresist for solvent development and a method for producing the same.

More specifically, an object of the present invention is to provide a polysiloxane composition which is a composition comprising a hydrolysis condensation product of a hydrolyzable silane that can be replaced with a developing solution for solvent development or a rinsing solution for solvent development when fine resist patterns are formed in a solvent development process, and which does not cause collapse of resist patterns and can be filled into resist patterns without filling defects between the resist patterns and without dissolving the resist patterns and a method for producing the same. In addition, an object of the present invention is to provide a method in which a coating composition containing a polymer (polysiloxane) is applied to a patterned resist film and filled between patterns, and after drying, a polymer (coating film) is formed between resist patterns, and the pattern is reversed by gas etching using a difference in gas etching rate between the patterned resist film and the polymer formed between the patterns, and a coating composition used in the method and a method for producing the same.

Means for Solving the Problems

In the present invention, a first aspect is a method for producing a composition applied to a patterned resist film, comprising: a step (A) of obtaining a hydrolysis condensation product by hydrolyzing and condensing a hydrolyzable silane in a non-alcoholic hydrophilic solvent; and a step (B) of solvent replacement in which the non-alcoholic hydrophilic solvent is replaced with a hydrophobic solvent for the hydrolysis condensation product.

As a second aspect, in the production method according to the first aspect, the hydrolyzable silane is Formula (1):

$$R^1_a Si(R^2)_{4-a} \qquad \text{Formula (1)}$$

(in Formula (1), $R^1$ is an alkyl group, an aryl group, a halogenated alkyl group, a halogenated aryl group or an alkenyl group, or an organic group having an epoxy group, a mercapto group, an acryl group, a methacryl group or a cyano group and bonded to a silicon atom via a Si—C bond, $R^2$ is an alkoxy group, an acyloxy group, or a halogen group, and a is an integer of 0 or 1), and a hydrolyzable silane (1-1) in which a is 0 in Formula (1) and a hydrolyzable silane (1-2) in which a is 1 in Formula (1) are included in a molar ratio of (1-1):(1-2)=0 to 50:100 to 50 in the total amount of hydrolyzable silane.

As a third aspect, in the production method according to the first aspect or the second aspect, the non-alcoholic hydrophilic solvent used in the step (A) is an aliphatic ketone having a carbon atom number of 3 or 4 and the hydrophobic solvent used in the step (B) is an aliphatic or aromatic ester, ether, or alcohol having a carbon atom number of 5 to 20.

As a fourth aspect, in the production method according to the first aspect or the second aspect, the non-alcoholic hydrophilic solvent used in the step (A) is acetone and the hydrophobic solvent used in the step (B) is an aliphatic carboxylic acid ester, dialkyl ether, or alkyl alcohol having a carbon atom number of 5 to 20.

As a fifth aspect, in the production method according to any one of the first aspect to the fourth aspect, the composition further includes an acid or a base.

As a sixth aspect, in the production method according to any one of the first aspect to the fifth aspect, the composition further includes a surfactant.

As a seventh aspect, in the production method according to any one of the first aspect to the sixth aspect, the composition further includes a photoacid generating agent.

As an eighth aspect, there is provided a method for producing a semiconductor device, comprising: a step (1) of applying a resist composition to a substrate and forming a resist film; a step (2) of exposing and developing the formed resist film; a step (3) of applying the composition obtained by the production method according to any one of the first aspect to the seventh aspect to a patterned resist film obtained during development or after development in the step (2), and forming a coating film between patterns; and a step (4) of removing the patterned resist film by etching and reversing the patterns.

As a ninth aspect, there is provided a method for producing a semiconductor device, comprising: a step (1-1) of forming a resist underlayer film on a substrate, applying a resist composition to the resist underlayer film, and forming a resist film; a step (2) of exposing and developing the formed resist film; a step (3) of applying the composition obtained by the production method according to any one of claims 1 to 7 to a patterned resist film obtained during development or after development in the step (2) and forming a coating film between patterns; and a step (4-1) of removing the patterned resist film and a resist underlayer film thereunder by etching and reversing the patterns.

As a tenth aspect, there is provided a method for producing a semiconductor device, comprising: a step (1-2) of applying a resist composition to a substrate or a resist underlayer film formed on the substrate and forming a resist film; a step (2) of exposing and developing the formed resist film; a step (3-2) of applying the composition obtained by the production method according to any one of claims 1 to 7 to a patterned resist film obtained during development or after development in the step (2), forming a coating film between the patterns and on upper surface of the resist film, and then etching back the surface of the coating film and exposing an upper surface of the patterned resist film; and a step (4-2) of removing the patterned resist film or the patterned resist film and a resist underlayer film thereunder by etching and reversing the patterns.

As an eleventh aspect, in the production method according to any one of the eighth aspect to the tenth aspect, exposure is performed using an ArF laser (with a wavelength of 193 nm) or EUV (with a wavelength of 13.5 nm).

As a twelfth aspect, in the production method according to any one of the eighth aspect to the eleventh aspect, the development is negative development with an organic solvent.

Effects of the Invention

When resist patterns become finer, even if the developing solution or the rinsing solution is spin-dried during the development step or the rinsing step, collapse of patterns still occurs due to a Laplace force. The present invention can provide a method for preventing such pattern collapse and a coating composition used in the method and a method for producing the same.

In the present invention, when a hydrolyzable silane is hydrolyzed in a non-alcoholic hydrophilic solvent, silanol groups generated due to hydrolysis do not revert to alkoxy groups again, and thus an almost or completely hydrolyzed hydrolysate is obtained, and when this hydrolysate is condensed, a hydrolysis condensation product of a hydrolyzable silane having a small amount of silanol groups remaining is obtained.

When a hydrolyzable silane is hydrolyzed in an alcohol-based solvent, the generated silanol groups react again with the alcohol-based solvent and alkoxy groups are generated. However, in the present invention, alkoxy groups are not formed again when a hydrolyzable silane is hydrolyzed in a non-alcoholic hydrophilic solvent.

Since the hydrolysis condensation product obtained by condensing an almost or completely hydrolyzed hydrolysate is changed to a hydrophobic substance as condensing progresses, the solvent is accordingly changed from a non-alcoholic hydrophilic solvent to a hydrophobic solvent for solvent replacement. It is possible to obtain a coating composition stably including a polysiloxane with a high hydrolysis condensation degree. Since the coating composition exists stably, it can be smoothly impregnated between resist patterns and can fill gaps between resist patterns.

In the present invention, it is possible to apply a composition including a hydrolysis condensation product (polysiloxane) of a hydrolyzable silane produced in this manner to a patterned resist film. In particular, the patterned resist film is a negative development patterned resist film formed according to negative development, and the coating composition of the present invention is suitably used for application to the patterned resist film. For example, when negative development is performed after exposure using a positive resist, the positive resist after exposure is developed in a hydrophobic organic solvent. However, when the coating composition used in the present invention is applied to the resist film during development or after development, the coating film can be favorably filled between resist patterns or can cover the upper surface of the patterned resist film. When negative development is performed after exposure using a negative resist, the composition used in the present invention is applied to the resist film during development or after development, and can be favorably filled between resist patterns and can cover the upper surface of the patterned resist film.

The composition filled between resist patterns or covering the upper surface of the patterned resist film in this manner is heated and cured after the solvent is removed to form a coating film, and oxygen dry etching for removing the patterned resist film is then performed and the pattern is reversed and replaced with patterns by a polysiloxane (coating film).

Here, before the dry etching, the composition or coating film of the present invention applied to the resist pattern is etched back with a fluorine-based gas to expose the resist pattern, and oxygen dry etching for removing the resist pattern can then be performed.

MODES FOR CARRYING OUT THE INVENTION

Figure 1:
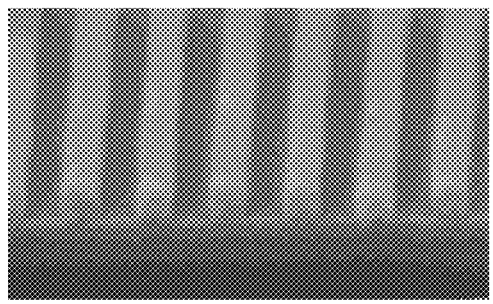
FIG. 1 shows a cross-sectional SEM image (with a magnification of 150,000) of a reverse pattern obtained in Example 33 using a coating composition of Preparation Example 1.
Figure 2:
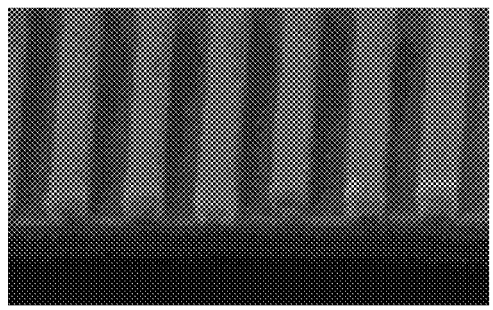
FIG. 2 shows a cross-sectional SEM image (with a magnification of 150,000) of a reverse pattern obtained in Example 34 using a coating composition of Preparation Example 2.
Figure 3:
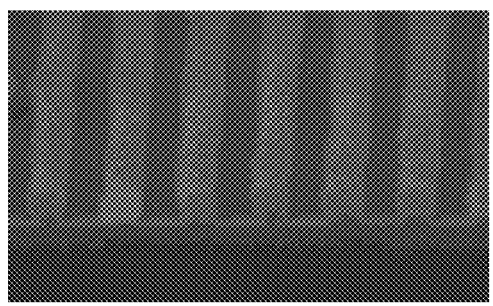
FIG. 3 shows a cross-sectional SEM image (with a magnification of 150,000) of a reverse pattern obtained in Example 35 using a coating composition of Preparation Example 4.
Figure 4:
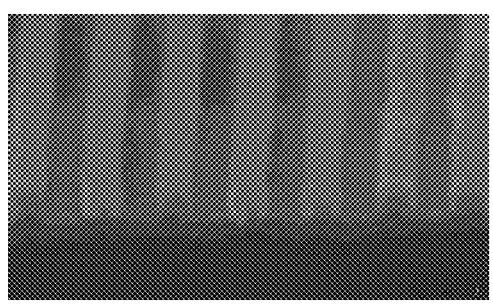
FIG. 4 shows a cross-sectional SEM image (with a magnification of 150,000) of a reverse pattern obtained in Example 36 using a coating composition of Preparation Example 5.
Figure 5:
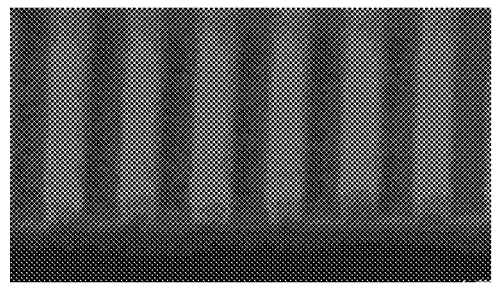
FIG. 5 shows a cross-sectional SEM image (with a magnification of 150,000) of a reverse pattern obtained in Example 37 using a coating composition of Preparation Example 6.
Figure 6:
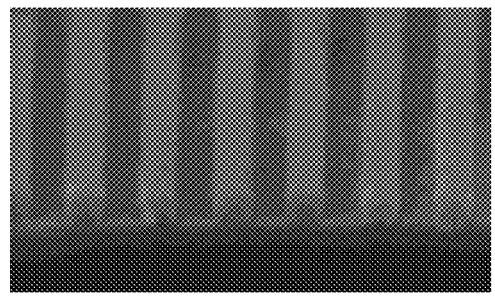
FIG. 6 shows a cross-sectional SEM image (with a magnification of 150,000) of a reverse pattern obtained in Example 38 using a coating composition of Preparation Example 8.
Figure 7:
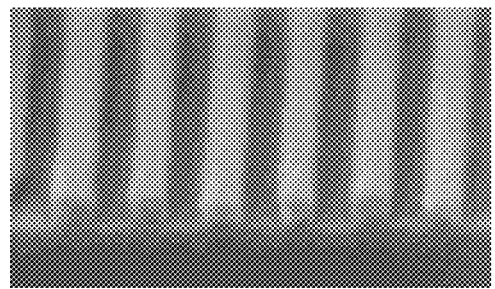
FIG. 7 shows a cross-sectional SEM image (with a magnification of 150,000) of a reverse pattern obtained in Example 39 using a coating composition of Preparation Example 10.
Figure 8:
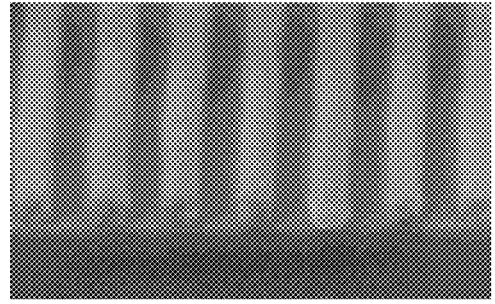
FIG. 8 shows a cross-sectional SEM image (with a magnification of 150,000) of a reverse pattern obtained in Example 40 using a coating composition of Preparation Example 11.
Figure 9:
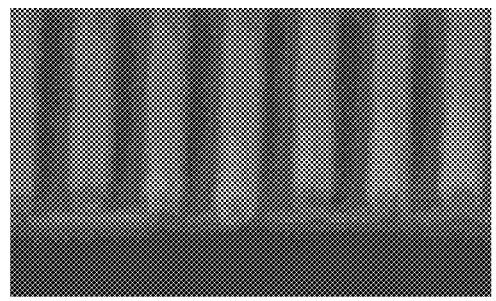
FIG. 9 shows a cross-sectional SEM image (with a magnification of 150,000) of a reverse pattern obtained in Example 41 using a coating composition of Preparation Example 13.

The present invention provides a method for producing a composition applied to a patterned resist film including a step (A) of obtaining a hydrolysis condensation product by hydrolyzing and condensing a hydrolyzable silane in a non-alcoholic hydrophilic solvent and a step (B) of solvent replacement in which the non-alcoholic hydrophilic solvent is replaced with a hydrophobic solvent for the hydrolysis condensation product.

In the present invention, when a hydrolyzable silane is hydrolyzed in a non-alcoholic hydrophilic solvent, silanol groups generated due to hydrolysis do not revert to alkoxy groups again, and a completely hydrolyzed hydrolysate is obtained, and when this hydrolysate is condensed, a hydrolysis condensation product of a hydrolyzable silane having a small amount of silanol groups remaining is obtained. In addition, a part of a hydrolyzable silane may be hydrolyzed to obtain a hydrolysate and this hydrolysate is condensed so that a hydrolysis condensation product can be obtained.

The composition is a composition in which a hydrolysis condensation product (polysiloxane) is dissolved in a solvent, and may contain a hydrolyzable silane and/or a hydrolysate thereof. A solid content is 0.5 to 20.0% by mass, or 1.0 to 10.0% by mass. The solid content is the remaining components obtained by removing the solvent from the composition.

A proportion of the hydrolysis condensation product (polysiloxane) of the hydrolyzable silane in the solid content is 50 to 100% by mass or 80 to 100% by mass.

A concentration of the hydrolysis condensation product (polysiloxane) of the hydrolyzable silane in the composition is 0.25 to 20.0% by mass, 0.5 to 20.0% by mass, or 1.0 to 10.0% by mass.

In the present invention, since a coating composition (a composition applied to a patterned resist film) is used after a resist film is exposed, the composition is filled between resist patterns that are being formed while a resist film that is exposed through a mask is developed or between the developed resist patterns.

The hydrolysis condensation product of the hydrolyzable silane includes a resin component different from that of the resist.

Thereby, in a later dry etching step, by selecting a type of gas, the resist is selectively removed by dry etching and a new pattern by filling of the hydrolysis condensation product (polysiloxane) is formed.

As the hydrolyzable silane, a hydrolyzable silane of Formula (1) can be used.

In Formula (1), $R^1$ is an alkyl group, an aryl group, a halogenated alkyl group, a halogenated aryl group or an alkenyl group, or an organic group having an epoxy group, a mercapto group, an acryl group, a methacryl group or a cyano group and bonded to a silicon atom via a Si—C bond, $R^2$ is an alkoxy group, an acyloxy group, or a halogen group.

In Formula (1), a is an integer of 0 or 1. The hydrolyzable silane may include a hydrolyzable silane (1-1) in which a is 0 in Formula (1) and a hydrolyzable silane (1-2) in which a is 1 in Formula (1) at a molar ratio of (1-1):(1-2)=0 to 50:100 to 50.

The alkyl group is a linear or branched alkyl group having a carbon atom number of 1 to 10, and examples thereof include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group and 1-ethyl-2-methyl-n-propyl group.

In addition, as the alkyl group, a cyclic alkyl group can be used. Examples of a cyclic alkyl group having a carbon atom number of 1 to 10 include cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group and 2-ethyl-3-methyl-cyclopropyl group.

As the aryl group, an aryl group having a carbon atom number of 6 to 20 may be exemplified. Examples thereof include phenyl group, o-methylphenyl group, m-methylphenyl group, p-methylphenyl group, o-chlorophenyl group, m-chlorophenyl group, p-chlorophenyl group, o-fluorophenyl group, p-mercaptophenyl group, o-methoxyphenyl group, p-methoxyphenyl group, p-aminophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group and 9-phenanthryl group.

Examples of the halogenated alkyl group and the halogenated aryl group include organic groups in which some or all hydrogen atoms of the alkyl group or aryl group are substituted with halogen atoms such as fluorine, chlorine, bromine, or iodine atoms.

As the alkenyl group, for example, an alkenyl group having a carbon atom number of 2 to 10 in which one or more $CH_2$—$CH_2$ present in the alkyl group are substituted with CH=CH may be exemplified. Examples thereof include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethyl-1-ethenyl group, 1-methyl-1-propenyl group, 1-methyl-2-propenyl group, 1-pentenyl group, 2-pentenyl group, 3-pentenyl group, 4-pentenyl group, 1-n-propyl ethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propyl ethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butyl ethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butyl ethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group and 3-cyclohexenyl group.

Examples of organic groups having an epoxy group include glycidoxymethyl, glycidoxyethyl, glycidoxypropyl, glycidoxybutyl, and epoxycyclohexyl.

Examples of organic groups having a mercapto group include ethyl mercapto, butyl mercapto, hexyl mercapto, and octyl mercapto.

Examples of organic groups having a cyano group include cyanoethyl and cyanopropyl.

Examples of organic groups having an acrylic group include acryloxymethyl group, acryloxyethyl group, acryloxypropyl group, and (3-acryloxypropyl)dimethylsiloxy group.

Examples of organic groups having a methacrylic group include methacryloxymethyl group, methacryloxyethyl group, methacryloxypropyl group, and (3-methacryloxypropyl)dimethylsiloxy group.

As the alkoxy group in $R^2$ in Formula (1), a $C_{1-20}$ alkoxy group may be exemplified, and an alkoxy group having a carbon atom number of 1 to 20 and a linear, branched, or cyclic alkyl moiety may be exemplified, and examples thereof include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group and 1-ethyl-2-methyl-n-propoxy group, and examples of the cyclic alkoxy group include cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group and 2-ethyl-3-methyl-cyclopropoxy group.

As the acyloxy group in $R^2$ in Formula (1), a $C_{1-20}$ acyloxy group may be exemplified, and examples thereof include methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of the halogen group in $R^2$ in Formula (1) include halogen groups such as fluorine, chlorine, bromine, and iodine groups.

In the present invention, as the non-alcoholic hydrophilic solvent used in the step (A), an aliphatic ketone having a carbon atom number of 3 or 4 may be exemplified, and examples thereof include acetone, and methyl ethyl ketone. Particularly, acetone is preferable.

As the hydrophobic solvent used for solvent replacement in the step (B), an aliphatic or aromatic ester, ether, or alcohol having a carbon atom number of 5 to 20 or having a carbon atom number of 6 to 20 may be exemplified, and examples thereof include an aliphatic carboxylic acid ester, dialkyl ether, or alkyl alcohol having a carbon atom number of 5 to 20 or having a carbon atom number of 6 to 20.

Examples of the aliphatic carboxylic acid ester include short chain fatty acid esters such as acetic acid esters, propionic acid esters, butyric acid esters, isobutyric acid esters, valerate esters, and isovalerate esters having a carbon atom number of 5 to 20 or having a carbon atom number of 6 to 20.

Examples of the dialkyl ether include a dialkyl ether having two alkyl groups having a carbon atom number of 4 or more and having a total of 8 to 20 carbon atoms.

Examples of the alkyl alcohol include an aliphatic linear or cyclic alcohol having a carbon atom number of 6 to 20.

The hydrolysis condensation product used in the present invention is exemplified below.

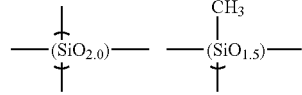

Formula (2-1)

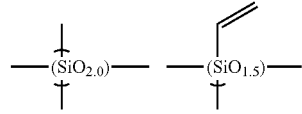

Formula (2-2)

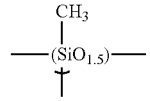

Formula (2-3)

The hydrolysis condensation product (polysiloxane) of the hydrolyzable silane can be obtained as, for example, a condensation product having a weight average molecular weight of 1,000 to 1,000,000, or 1,000 to 100,000.

Such a molecular weight is a molecular weight obtained in terms of polystyrene through GPC analysis.

Regarding GPC measurement conditions, for example, a GPC apparatus (product name HLC-8220 GPC, commercially available from Tosoh Corporation), and a GPC column (product name Shodex KF803L, KF802, KF801, commercially available from Showa Denko K.K.) can be used, a column temperature can be 40° C., an eluent (elution solvent) can be tetrahydrofuran, a flow rate (velocity) can be 1.0 ml/min, and polystyrene (commercially available from Showa Denko K.K.) can be used as a standard sample.

For hydrolysis of an alkoxysilyl group, an acyloxysilyl group, or a halogenated silyl group of the hydrolyzable silane, 0.5 to 100 mol, and preferably, 1 to 10 mol of water is used per mol of the hydrolyzable groups.

In addition, a hydrolysis catalyst can be used for hydrolysis, but hydrolysis can occur without using a hydrolysis catalyst. When a hydrolysis catalyst is used, 0.001 to 10 mol, and preferably, 0.001 to 1 mol of hydrolysis catalyst can be used per mol of the hydrolyzable groups.

A reaction temperature during hydrolysis and condensation is generally 20 to 10° C.

Regarding hydrolysis, hydrolysis may completely occur or hydrolysis may partially occur. That is, a hydrolysate or a hydrolyzable silane monomer may remain in the hydrolysis condensation product.

A catalyst can be used during hydrolyzing and condensation.

Examples of the hydrolysis catalyst include a metal chelate compound, an organic acid, an inorganic acid, an organic base, and an inorganic base.

Examples of the metal chelate compound as a hydrolysis catalyst include titanium chelate compounds such as triethoxy mono(acetylacetonato)titanium, tri-n-propoxy mono(acetylacetonato)titanium, tri-i-propoxy mono(acetylacetonato)titanium, tri-n-butoxy mono(acetylacetonato)titanium, tri-sec-butoxy mono(acetylacetonato)titanium, tri-t-butoxy mono(acetylacetonato)titanium, diethoxy-bis(acetylacetonato)titanium, di-n-propoxy-bis(acetylacetonato)titanium, di-i-propoxy-bis(acetylacetonato)titanium, di-n-butoxy bis(acetylacetonato)titanium, di-sec-butoxy-bis(acetylacetonato)titanium, di-t-butoxy-bis(acetylacetonato)titanium, monoethoxy-tris(acetylacetonato)titanium, mono-n-propoxy-tris(acetylacetonato)titanium, mono-i-propoxy-tris(acetylacetonato)titanium, mono-n-butoxy-tris(acetylacetonato)titanium, mono-sec-butoxy-tris(acetylacetonato)titanium, mono-t-butoxy-tris(acetylacetonato)titanium, tetrakis(acetylacetonato)titanium, triethoxy mono(ethylacetoacetato)titanium, tri-n-propoxy mono(ethylacetoacetato)titanium, tri-i-propoxy mono(ethylacetoacetato)titanium, tri-n-butoxy mono(ethylacetoacetato)titanium, tri-sec-butoxy mono(ethylacetoacetato)titanium, tri-t-butoxy mono(ethylacetoacetato)titanium, diethoxy-bis(ethylacetoacetato)titanium, di-n-propoxy bis(ethylacetoacetato)titanium, di-i-propoxy bis(ethylacetoacetato)titanium, di-n-butoxy bis(ethylacetoacetato)titanium, di-sec-butoxy bis(ethylacetoacetato)titanium, di-t-butoxy-bis(ethylacetoacetato)titanium, monoethoxy-tris(ethylacetoacetato)titanium, mono-n-propoxy tris(ethylacetoacetato)titanium, mono-i-propoxy-tris(ethylacetoacetato)titanium, mono-n-butoxy-tris(ethylacetoacetato)titanium, mono-sec-butoxy-tris(ethylacetoacetato)titanium, mono-t-butoxy-tris(ethylacetoacetato)titanium, tetrakis(ethylacetoacetato)titanium, mono(acetylacetonato)tris(ethylacetoacetato)titanium, bis(acetylacetonato)bis(ethylacetoacetato)titanium, and tris(acetylacetonato) mono(ethylacetoacetato)titanium; zirconium chelate compounds such as triethoxy mono(acetylacetonato)zirconium, tri-n-propoxy-mono(acetylacetonato)zirconium, tri-i-propoxy-mono(acetylacetonato)zirconium, tri-n-butoxy-mono(acetylacetonato)zirconium, tri-sec-butoxy-mono (acetylacetonato)zirconium, tri-t-butoxy-mono (acetylacetonato)zirconium, diethoxy-bis(acetylacetonato) zirconium, di-n-propoxy-bis(acetylacetonato)zirconium, di-i-propoxy-bis(acetylacetonato)zirconium, di-n-butoxy-bis(acetylacetonato)zirconium, di-sec-butoxy-bis(acetylacetonato)zirconium, di-t-butoxy-bis(acetylacetonato)zirconium, monoethoxy-tris(acetylacetonato)zirconium, mono-n-propoxy-tris(acetylacetonato)zirconium, mono-i-propoxy-tris(acetylacetonato)zirconium, mono-n-butoxy-tris(acetylacetonato)zirconium, mono-sec-butoxy-tris(acetylacetonato)zirconium, mono-t-butoxy-tris(acetylacetonato)zirconium, tetrakis(acetylacetonato)zirconium, triethoxy-mono(ethylacetoacetato)zirconium, tri-n-propoxy-mono(ethylacetoacetato)zirconium, tri-i-propoxy-mono(ethylacetoacetato)zirconium, tri-n-butoxy-mono(ethylacetoacetato)zirconium, tri-sec-butoxy-mono(ethylacetoacetato)zirconium, tri-t-butoxy-mono(ethylacetoacetato)zirconium, diethoxy-bis(ethylacetoacetato)zirconium, di-n-propoxy-bis(ethylacetoacetato)zirconium, di-i-propoxy-bis(ethylacetoacetato) zirconium, di-n-butoxy-bis(ethylacetoacetato)zirconium, di-sec-butoxy-bis(ethylacetoacetato)zirconium, di-t-butoxy-bis(ethylacetoacetato)zirconium, monoethoxy-tris(ethylacetoacetato)zirconium, mono-n-propoxy-tris(ethylacetoacetato)zirconium, mono-i-propoxy-tris(ethylacetoacetato)zirconium, mono-n-butoxy-tris(ethylacetoacetato)zirconium, mono-sec-butoxy-tris(ethylacetoacetato)zirconium, mono-t-butoxy-tris(ethylacetoacetato)zirconium, tetrakis(ethylacetoacetato)zirconium, mono(acetylacetonato)tris(ethylacetoacetato)zirconium, bis(acetylacetonato)bis(ethylacetoacetato)zirconium, and tris(acetylacetonato)mono(ethylacetoacetato)zirconium; and aluminum chelate compounds such as tris(acetylacetonato)aluminum, and tris(ethylacetoacetato)aluminum.

Examples of the organic acid as a hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid as a hydrolysis catalyst include hydrochloric acid, nitric acid, sulfuric acid, hydrofluoric acid, and phosphoric acid.

Examples of the organic base as a hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, and tetraethylammonium hydroxide. Examples of the inorganic base include ammonia, sodium hydroxide, potassium hydroxide, barium hydroxide, and calcium hydroxide.

After the hydrolysis condensation product (polysiloxane) solution is obtained, the solvent and the alcohol used for the hydrolysis are removed and can be replaced with a hydrophobic solvent (an aliphatic or aromatic ester, ether, or alcohol having a carbon atom number of 5 to 20 or having a carbon atom number of 6 to 20).

In addition, a hydrophobic solvent is added to the hydrolysis condensation product (polysiloxane) solution, and the solvent and the alcohol used for the hydrolysis are removed and can be replaced with a hydrophobic solvent.

The hydrolyzable silane is hydrolyzed in the solvent using a catalyst and condensed, and the alcohol as byproduct, and the hydrolysis catalyst and water used are distilled off from the obtained hydrolysis condensation product (polymer) solution under a reduced pressure and can be removed at the same time. In addition, the acid and base catalyst used for the hydrolysis can be removed through neutralization and ion exchange.

In addition, in order to stabilize a composition including the hydrolysis condensation product, an inorganic acid, an organic acid, water, an alcohol, an organic amine, a photoacid generating agent, a metal oxide, a surfactant, or a combination thereof can be added to the composition applied to a patterned resist film of the present invention.

An organic acid or inorganic acid to be added has sufficient solubility in the hydrophobic solvent used in the step (B) and when a small amount thereof is added, it is possible to improve the storage stability of the hydrolyzable condensation product.

Examples of the inorganic acid include hydrochloric acid, nitric acid, sulfuric acid, and phosphoric acid.

Examples of the organic acid include oxalic acid, malonic acid, methylmalonic acid, succinic acid, maleic acid, malic acid, tartaric acid, phthalic acid, citric acid, glutaric acid, citric acid, lactic acid, salicylic acid, and methanesulfonic acid. Particularly, methanesulfonic acid, oxalic acid, maleic acid, octanoic acid, decanoic acid, octanesulfonic acid, decanesulfonic acid, dodecylbenzenesulfonic acid, phenolsulfonic acid, sulfosalicylic acid, camphorsulfonic acid, nonafluorobutanesulfonic acid, toluenesulfonic acid, cumenesulfonic acid, p-octylbenzenesulfonic acid, p-decylbenzenesulfonic acid, 4-octyl 2-phenoxybenzene sulfonic acid, 4-carboxybenzene sulfonic acid, and the like are preferable.

A proportion of an acid to be added is 0.5 to 15 parts by mass with respect to 100 parts by mass of the condensation product (polysiloxane).

In addition, it is preferable that an alcohol that is likely to disperse due to heating after application be added. For example, methanol, ethanol, propanol, isopropanol, and butanol may be used. A proportion of an alcohol to be added can be 0.001 to 20 parts by mass with respect to 100 parts by mass of the composition applied to a patterned resist film.

In addition, examples of an organic amine to be added include aminoethanol, methylaminoethanol, N,N,N',N'-tetramethylethylenediamine, N,N,N',N'-tetraethylethylenediamine, N,N,N',N'-tetrapropylethylenediamine, N,N,N',N'-tetraisopropylethylenediamine, N,N,N',N'-tetrabutylethylenediamine, N,N,N',N'-tetraisobutylethylenediamine, N,N,N',N'-tetramethyl-1,2-propylenediamine, N,N,N',N'-tetraethyl-1,2-propylenediamine, N,N,N',N'-tetrapropyl-1,2-propylenediamine, N,N,N',N'-tetraisopropyl-1,2-propylenediamine, N,N,N',N'-tetrabutyl-1,2-propylenediamine, N,N,N',N'-tetraisobutyl-1,2-propylenediamine, N,N,N',N'-tetramethyl-1,3-propylenediamine, N,N,N',N'-tetraethyl-1,3-propylenediamine, N,N,N',N'-tetrapropyl-1,3-propylenediamine, N,N,N',N'-tetraisopropyl-1,3-propylenediamine, N,N,N',N'-tetrabutyl-1,3-propylenediamine, N,N,N',N'-tetraisobutyl-1,3-propylenediamine, N,N,N',N'-tetramethyl-1,2-butylenediamine, N,N,N',N'-tetraethyl-1,2-butylenediamine, N,N,N',N'-tetrapropyl-1,2-butylenediamine, N,N,N',N'-tetraisopropyl-1,2-butylenediamine, N,N,N',N'-tetrabutyl-1,2-butylenediamine, N,N,N',N'-tetraisobutyl-1,2-butylenediamine, N,N,N',N'-tetramethyl-1,3-butylenediamine, N,N,N',N'-tetraethyl-1,3-butylenediamine, N,N,N',N'-tetrapropyl-1,3-butylenediamine, N,N,N',N'-tetraisopropyl-1,3-butylenediamine, N,N,N',N'-tetrabutyl-1,3-butylenediamine, N,N,N',N'-tetraisobutyl-1,3-butylenediamine, N,N,N',N'-tetramethyl-1,4-butylenediamine, N,N,N',N'-tetraethyl-1,4-butylenediamine, N,N,N',N'-tetrapropyl-1,4-butylenediamine, N,N,N',N'-tetraisopropyl-1,4-butylenediamine, N,N,N',N'-tetrabutyl-1,4-butylenediamine, N,N,N',N'-tetraisobutyl-1,4-butylenediamine, N,N,N',N'-tetramethyl-1,5-pentylenediamine, and N,N,N',N'-tetraethyl-1, 5-pentylenediamine.

A proportion of an organic amine to be added can be 0.001 to 20 parts by mass with respect to 100 parts by mass of the composition applied to a patterned resist film.

In addition, examples of a photoacid generating agent to be added include an onium salt compound, a sulfonimide compound, and a disulfonyl diazomethane compound.

Examples of the onium salt compound include iodonium salt compounds such as diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate and bis(4-tert-butylphenyl)iodonium trifluoromethanesulfonate, and sulfonium salt compounds such as triphenylsulfonium hexafluoroantimonate, triphenylsulfonium nonafluoro-n-butanesulfonate, triphenylsulfonium camphorsulfonate, triphenylsulfonium trifluoromethanesulfonate, triphenylsulfonium adamantane carboxylate trifluoroethanesulfonate, triphenylsulfonium p-toluenesulfonate, triphenylsulfonium methanesulfonate, triphenylsulfonium phenolsulfonate, triphenylsulfonium nitrate, triphenylsulfonium maleate, bis(triphenylsulfonium) maleate, triphenylsulfonium hydrochloride, triphenylsulfonium acetate, triphenylsulfonium trifluoroacetate, triphenylsulfonium salicylate, triphenylsulfonium benzoate, and triphenylsulfonium hydroxide.

Examples of the sulfonimide compound include N-(trifluoromethanesulfonyloxy) succinimide, N-(nonafluoro-n-butanesulfonyloxy)succinimide, N-(camphorsulfonyloxy) succinimide and N-(trifluoromethanesulfonyloxy) naphthalimide.

Examples of the disulfonyl diazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

Only one type of photoacid generating agent can be used or two or more types thereof can be used in combination.

When a photoacid generating agent is used, a proportion thereof is 0.01 to 30 parts by mass, 0.1 to 20 parts by mass, or 0.5 to 10 parts by mass with respect to 100 parts by mass of the condensation product (polysiloxane).

In addition, a proportion of a metal oxide to be added can be 0.001 to 100 parts by mass with respect to 100 parts by mass of the composition applied to a patterned resist film.

Examples of a metal oxide or a partial metal oxide to be added include a hydrolysis condensation product including TiOx (titanium oxide, x=1 to 2), a hydrolysis condensation product including WOx (tungsten oxide, x=1 to 3), a hydrolysis condensation product including HfOx (hafnium oxide, x=1 to 2), a hydrolysis condensation product including ZrOx (zirconium oxide, x=1 to 2), a hydrolysis condensation product including AlOx (aluminum oxide, x=1 to 1.5), metatungstic acid, ammonium metatungstate, silicotungstic acid, ammonium silicotungstate, molybdic acid, ammonium molybdate, phosphomolybdic acid, and phosphomolybdic acid ammonium salts. A proportion of a metal oxide to be added can be 0.001 to 100 parts by mass with respect to 100 parts by mass of the composition applied to a patterned resist film. The metal oxide or partial metal oxide can be obtained as a hydrolysis condensation product of a metal alkoxide, and the partial metal oxide may have an alkoxide group.

Examples of the surfactant included in the composition of the present invention include a nonionic surfactant, a fluorine-based surfactant, an anionic surfactant, a cationic surfactant, a silicon-based surfactant, and a UV curable surfactant.

Nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl allyl ethers such as polyoxyethylene octylphenol ether, and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine-based surfactants such as product name EFTOP EF301, EF303, and EF352 (commercially available from Tochem Products Co., Ltd.), product name Megaface F171, F173, R-08, R-30, R-40, and R-40N (commercially available from DIC Corporation), Fluorad FC430 and FC431 (commercially available from Sumitomo 3M Limited), product name Asahi Guard AG710, and Surflon S-382, SC101, SC102, SC103, SC104, SC105, and SC106 (commercially available from AGC Inc.), silicon-based surfactants such as organosiloxane polymer KP341 (product name, commercially available from Shin-Etsu Chemical Co., Ltd.), BYK302, BYK307, BYK333, BYK341, BYK345, BYK346, BYK347, and BYK348 (product name, commercially available from BYK), cationic surfactants such as distearyl dimethyl ammonium chloride, benzalkonium chloride, benzethonium chloride, cetylpyridinium chloride, hexadecyltrimethylammonium bromide, and dequalinium chloride, anionic surfactants such as octanoates, decanoates, octanesulfonates, decanoate sulfonate, palmitates, perfluorobutanesulfonates, and dodecylbenzenesulfonates, and UV curable surfactants such as BYK307, BYK333, BYK381, BYK-UV-3500, BYK-UV-3510, and BYK-UV-3530 (product name, commercially available from BYK) may be exemplified.

Such surfactants can be used alone or two or more types thereof can be used in combination.

When a surfactant is used, a proportion thereof is 0.0001 to 5 parts by mass, 0.001 to 5 parts by mass, or 0.01 to 5 parts by mass with respect to 100 parts by mass of the condensation product (polyorganosiloxane).

The present invention relates to a method for producing a semiconductor device including step (1) of applying a resist composition to a substrate and forming a resist film, step (2) of exposing and developing the formed resist film, step (3) of applying the above-described composition to a patterned resist film obtained during development or after development in step (2) and forming a coating film between patterns, and step (4) of removing the patterned resist film by etching and reversing the pattern.

A photoresist used in step (1) is not particularly limited as long as it is sensitive to light used for exposure. Any of a negative photoresist and a positive photoresist can be used.

For example, a positive photoresist including a novolac resin and 1,2-naphthoquinone diazide sulfonic acid ester, a chemically amplified photoresist including a binder having a group that is decomposed by an acid and increases an alkali dissolution rate and a photoacid generating agent, a chemically amplified photoresist including a low molecular weight compound that is decomposed by an acid and increases an alkali dissolution rate of a photoresist, an alkali soluble binder, and a photoacid generating agent, and a chemically amplified photoresist including a binder having a group that is decomposed by an acid and increases an alkali dissolution rate, a low molecular weight compound that is decomposed by an acid and increases an alkali dissolution rate of a photoresist, and a photoacid generating agent may be exemplified. For example, product name APEX-E (commercially available from Shipley Company), product name PAR710 (commercially available from Sumitomo Chemical Co., Ltd.) and product name SEPR430 (commercially available from Shin-Etsu Chemical Co., Ltd.) may be exemplified. In addition, for example, a fluorine atom-containing polymer photoresist described in Proc. SPIE, Vol. 3999, 330-334 (2000), Proc. SPIE, Vol. 3999, 357-364 (2000), and Proc. SPIE, Vol. 3999, 365-374 (2000) may be exemplified.

In addition, as an electron beam resist, any of negative and positive electron beam resists can be used.

For example, a chemically amplified resist including an acid generating agent and a binder having a group that is decomposed due to an acid and changes an alkali dissolution rate, a chemically amplified resist including an alkali soluble binder, an acid generating agent, and a low molecular weight compound that is decomposed due to an acid and changes an alkali dissolution rate of a resist, and a chemically amplified resist including an acid generating agent, a binder having a group that is decomposed due to an acid and changes an alkali dissolution rate, and a low molecular weight compound that is decomposed due to an acid and changes an alkali dissolution rate of a resist, a non-chemically amplified resist including a binder having a group that is decomposed due to an electron beam and changes an alkali dissolution rate, and a non-chemically amplified resist including a binder having a moiety that is cut due to an electron beam and changes an alkali dissolution rate may be exemplified. Even if such an electron beam resist is used, it is possible to form a resist pattern in the same manner as when a photoresist is used as an electron beam such as an irradiation source.

After a resist solution is applied, baking is performed at a baking temperature of 70 to 150° C. for a baking time of 0.5 to 5 minutes, and a resist film with a film thickness in a range of 10 to 1,000 nm is obtained. The resist solution and the developing solution, and the following coating composition can be coated by a spin coating, a dipping method, a spraying method, or the like. In particular, a spin coating method is preferable. The resist is exposed through a predetermined mask. For exposure, a KrF excimer laser (with a wavelength of 248 nm), an ArF excimer laser (with a wavelength of 193 nm), an EUV light (with a wavelength of 13.5 nm), an electron beam, and the like can be used. After exposure, as necessary, post exposure bake (PEB) can be performed. For post exposure bake, a heating temperature of 70° C. to 150° C. and a heating time of 0.3 to 10 minutes are appropriately selected.

The method for producing a semiconductor device of the present invention can include step (1-1) of forming a resist underlayer film on a substrate, applying a resist composition to the resist underlayer film, and forming a resist film in place of step (1). The resist underlayer film has an antireflection and organic hard mask function.

When step (1-1) is performed, a resist underlayer film is formed on a semiconductor substrate, and a resist film can be formed thereon.

In addition, in step (1-1), a resist underlayer film is formed on a semiconductor substrate, a silicon hard mask is formed on the resist underlayer film, and a resist film can be formed on the hard mask.

The resist underlayer film formed in step (1-1) can be used to prevent irregular reflection when an upper layer resist is exposed and used to improve adhesion with the resist. For the resist underlayer film, for example, an acrylic resin and a novolac resin can be used. As the resist underlayer film, a film with a film thickness of 1 to 1,000 nm can be formed on the semiconductor substrate.

In addition, the resist underlayer film used in step (1-1) may be a hard mask using an organic resin and a material having a high carbon content and a low hydrogen content is used. For example, a polyvinyl naphthalene resin, a carbazole novolac resin, a phenol novolac resin, and a naphthol novolac resin may be exemplified. They can be used to form a film with a film thickness of 5 to 1,000 nm on the semiconductor substrate.

In addition, a polysiloxane obtained by hydrolyzing a hydrolyzable silane can be used for a silicon hard mask used in step (1-1). For example, a polysiloxane obtained by hydrolyzing tetraethoxysilane, methyltrimethoxysilane, and phenyltriethoxysilane may be exemplified. They can be used to form a film with a film thickness of 5 to 200 nm on the resist underlayer film.

In step (2), a resist film is exposed through a predetermined mask. For exposure, a KrF excimer laser (with a wavelength of 248 nm), an ArF excimer laser (with a wavelength of 193 nm) and EUV (with a wavelength of 13.5 nm) can be used. After exposure, as necessary, post exposure bake can be performed.

Post exposure bake is performed under conditions appropriately selected from a heating temperature of 70° C. to 150° C. and a heating time of 0.3 to 10 minutes.

Next, development is performed using a developing solution. Conditions for development are appropriately selected from a temperature of 5 to 50° C., and a time of 10 to 600 seconds.

In addition, in the present invention, an organic solvent can be used as the developing solution. After exposure, development is performed using a developing solution (solvent). Therefore, for example, when a positive photoresist is used, a part that is not exposed in the photoresist is removed, and a photoresist pattern is formed.

Examples of the developing solution include methyl acetate, butyl acetate, ethyl acetate, isopropyl acetate, amyl acetate, isoamyl acetate, ethyl methoxy acetate, ethyl ethoxy acetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methylacetoacetate, ethylacetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl-3-methoxypropionate.

In addition, a surfactant and the like can be added to such a developing solution. Conditions for development are appropriately selected from a temperature of 5 to 50° C. and a time of 10 to 600 seconds.

In step (3), a coating composition of the present invention is applied to a patterned resist film during development or after development. In step (3), the coating composition can be heated to form a coating film. Thereby, a coating film can be formed between resist patterns. Heating is performed at a baking temperature of 50 to 180° C. for 0.5 to 5 minutes.

In addition, in step (3), a coating composition of the present invention is applied to an upper surface of the patterned resist film and a coating film can be formed. In this case, step (3-2) of etching back the surface of the coating film and exposing the upper surface of the patterned resist film can be included. Thereby, in the subsequent step (4-2), the surface of the resist pattern and the surface of the coating composition match, due to a difference in gas etching rate between the patterned resist film and the coating film of the coating composition, only a resist component is removed, the component due to the coating film of the coating composition remains, and as a result, the pattern is reversed. In the etch back, the resist pattern is exposed with a gas (for example, a fluorine-based gas) with which the coating composition can be removed.

In step (4), the patterned resist film is removed by etching and the pattern is reversed. In step (4), dry etching is performed using a tetrafluoromethane, perfluorocyclobutane ($C_4F8$), perfluoropropane ($C_3F8$), trifluoromethane, carbon monoxide, argon, oxygen, nitrogen, sulfur hexafluoride, difluoromethane, nitrogen trifluoride, and chlorine trifluoride gas. In particular, it is preferable that dry etching be performed with an oxygen-based gas.

In addition, when a resist underlayer film or a resist film and a hard mask are provided on a substrate, steps (4-1) and (4-2) of removing the patterned resist film or the resist film and the resist underlayer film thereunder by etching and reversing the pattern can be performed.

Thereby, the initial patterned resist film is removed, and a reverse pattern is formed with a pattern reversal forming polymer (a hydrolysis condensation product of a hydrolyzable silane) contained in the coating composition.

EXAMPLES

Synthesis Example 1

Here, 52.1 g (50 mol %) of tetraethoxysilane, 44.6 g (50 mol %) of triethoxymethylsilane and 145 g of acetone were put into a 500 ml single-necked eggplant flask, and while stirring the mixed solution in the flask with a magnetic stirrer, 31.5 g of hydrochloric acid (0.1 mol/L) was added dropwise to the mixed solution. After dropwise addition, the flask was transferred to an oil bath adjusted to 95° C. and the mixture was reacted for 20 hours with heating to reflux.

Then, the reaction solution was cooled to room temperature and 100 g of butyl acetate was added thereto. Water, acetone, and hydrochloric acid, and ethanol as a reaction byproduct were distilled off from the reaction solution under a reduced pressure, and the reaction solution was concentrated to obtain a butyl acetate solution of a co-hydrolyzed condensation product (polysiloxane). A solid content concentration was 5% by mass and a weight average molecular weight Mw according to GPC was 3,000 in terms of polystyrene. This was used as a resist pattern coating composition.

Synthesis Example 2

Here, 52.1 g (40 mol %) of tetraethoxysilane, 66.9 g (60 mol %) of triethoxymethylsilane and 178 g of acetone were put into a 500 ml single-necked eggplant flask, and while stirring the mixed solution in the flask with a magnetic stirrer, 40.5 g of hydrochloric acid (0.1 mol/L) was added dropwise to the mixed solution. After dropwise addition, the flask was transferred to an oil bath adjusted to 95° C. and the mixture was reacted for 20 hours with heating to reflux. Then, the reaction solution was cooled to room temperature, and 120 g of butyl acetate was added thereto. Water, acetone, and hydrochloric acid, and ethanol as a reaction byproduct were distilled off from the reaction solution under a reduced pressure, and the reaction solution was concentrated to obtain a butyl acetate solution of a co-hydrolyzed condensation product (polysiloxane). A solid content concentration was 5% by mass and a weight average molecular weight Mw according to GPC was 3,000 in terms of polystyrene. This was used as a resist pattern coating composition.

Synthesis Example 3

Here, 31.4 g (30 mol %) of tetraethoxysilane, 62.4 g (70 mol %) of triethoxymethylsilane and 140 g of acetone were put into a 500 ml single-necked eggplant flask, and while stirring the mixed solution in the flask with a magnetic stirrer, 33.3 g of hydrochloric acid (0.1 mol/L) was added dropwise to the mixed solution. After dropwise addition, the flask was transferred to an oil bath adjusted to 95° C. and the mixture was reacted for 20 hours with heating to reflux. Then, the reaction solution was cooled to room temperature, and 95 g of butyl acetate was added thereto. Water, acetone, and hydrochloric acid, and ethanol as a reaction byproduct were distilled off from the reaction solution under a reduced pressure, and the reaction solution was concentrated to obtain a butyl acetate solution of a co-hydrolyzed condensation product (polysiloxane). A solid content concentration was 5% by mass and a weight average molecular weight Mw according to GPC was 2,500 in terms of polystyrene. This was used as a resist pattern coating composition.

Synthesis Example 4

Butyl acetate and a small amount of 4-methyl-2-pentanol were additionally added to the polysiloxane butyl acetate solution obtained in Synthesis Example 1, and adjustment was performed so that a solid content concentration was 5% by mass and a proportion of butyl acetate was 95 vol %, and a proportion of 4-methyl-2-pentanol was 5 vol % in a solvent composition ratio. The temperature of the adjusted solution was raised to 60° C. and the solution was reacted for additional two days. A weight average molecular weight Mw according to GPC of the obtained polymer was 4,000 in terms of polystyrene. This was used as a resist pattern coating composition.

Synthesis Example 5

Butyl acetate and a small amount of 4-methyl-2-pentanol were additionally added to the polysiloxane butyl acetate solution obtained in Synthesis Example 1, and adjustment was performed so that a solid content concentration was 5% by mass and a proportion of butyl acetate was 90 vol % and a proportion of 4-methyl-2-pentanol was 10 vol % in a solvent composition ratio. The temperature of the adjusted solution was raised to 60° C. and the solution was reacted for additional two days. A solid content concentration was 5% by mass, and a weight average molecular weight Mw of the obtained polymer according to GPC was 3,700 in terms of polystyrene. This was used as a resist pattern coating composition.

Comparative Synthesis Example 1

Here, 52.1 g (50 mol %) of tetraethoxysilane, 44.6 g (50 mol %) of triethoxymethylsilane and 145 g of butyl acetate were put into a 500 ml single-necked eggplant flask, and while stirring the mixed solution in the flask with a magnetic stirrer, 27.0 g of hydrochloric acid (0.01 mol/L) was added dropwise to the mixed solution. After dropwise addition, the flask was transferred to an oil bath adjusted to 95° C. and the mixture was reacted for 12 hours with heating to reflux. The reaction solution was cooled to room temperature, water and hydrochloric acid, and methanol as a reaction byproduct were distilled off from the reaction solution under a reduced pressure, and the reaction solution was concentrated to obtain a butyl acetate solution of a co-hydrolyzed condensation product (polysiloxane) with a solid content concentration of 5% by mass. This was used as a resist pattern coating composition.

[Replacement of Solvent in Polysiloxane Solution]

Replacement Example 1

Here, 10 g of the polymer solution obtained in Synthesis Example 1 was put into a 100 ml single-necked eggplant flask and butyl acetate in the solvent was distilled off under a reduced pressure as much as possible. Then, 20 g of tert-butyl acetate was added and the solvent was distilled off under a reduced pressure as much as possible. The above operation was additionally repeated three times so that a polymer solution in which the solvent was changed from butyl acetate to tert-butyl acetate was obtained. This was used as a resist pattern coating composition.

Replacement Example 2

Here, 10 g of the polymer solution obtained in Synthesis Example 1 was put into a 100 ml single-necked eggplant flask and butyl acetate in the solvent was distilled off under a reduced pressure as much as possible. Then, 20 g of pentyl acetate was added and the solvent was distilled off under a reduced pressure as much as possible. The above operation was additionally repeated three times so that a polymer solution in which the solvent was changed from butyl acetate to pentyl acetate was obtained. This was used as a resist pattern coating composition.

Replacement Example 3

Here, 10 g of the polymer solution obtained in Synthesis Example 1 was put into a 100 ml single-necked eggplant flask and butyl acetate in the solvent was distilled off under a reduced pressure as much as possible. Then, 20 g of normal hexyl acetate was added, and the solvent was distilled off under a reduced pressure as much as possible. The above operation was additionally repeated three times so that a polymer solution in which the solvent was changed from butyl acetate to normal hexyl acetate was obtained. This was used as a resist pattern coating composition.

Replacement Example 4

Here, 10 g of the polymer solution obtained in Synthesis Example 1 was put into a 100 ml single-necked eggplant flask and butyl acetate in the solvent was distilled off under a reduced pressure as much as possible. Then, 20 g of butyl butyrate was added, and the solvent was distilled off under a reduced pressure as much as possible. The above operation was additionally repeated three times so that a polymer solution in which the solvent was changed from butyl acetate to butyl butyrate was obtained. This was used as a resist pattern coating composition.

Replacement Example 5

Here, 10 g of the polymer solution obtained in Synthesis Example 1 was put into a 100 ml single-necked eggplant flask and butyl acetate in the solvent was distilled off under a reduced pressure as much as possible. Then, 20 g of diisoamyl ether was added, and the solvent was distilled off under a reduced pressure as much as possible. The above operation was additionally repeated three times so that a polymer solution in which the solvent was changed from butyl acetate to diisoamyl ether was obtained. This was used as a resist pattern coating composition.

Replacement Example 6

Here, 10 g of the polymer solution obtained in Synthesis Example 1 was put into a 100 ml single-necked eggplant flask and butyl acetate in the solvent was distilled off under a reduced pressure as much as possible. Then, 20 g of dibutyl ether was added, and the solvent was distilled off under a reduced pressure as much as possible. The above operation was additionally repeated three times so that a polymer solution in which the solvent was changed from butyl acetate to dibutyl ether was obtained. This was used as a resist pattern coating composition.

Replacement Example 7

Here, 10 g of the polymer solution obtained in Synthesis Example 1 was put into a 100 ml single-necked eggplant flask and butyl acetate in the solvent was distilled off under a reduced pressure as much as possible. Then, 20 g of 4-methyl-2-pentanol was added, and the solvent was distilled off under a reduced pressure as much as possible. The above operation was additionally repeated three times so that a polymer solution in which the solvent was changed from butyl acetate to 4-methyl-2-pentanol was obtained. This was used as a resist pattern coating composition.

Replacement Example 8

Here, 10 g of the polymer solution obtained in Synthesis Example 1 was put into a 100 ml single-necked eggplant flask and butyl acetate in the solvent was distilled off under a reduced pressure as much as possible. Then, 20 g of cyclohexanol was added, and the solvent was distilled off under a reduced pressure as much as possible. The above operation was additionally repeated three times so that a polymer solution in which the solvent was changed from butyl acetate to cyclohexanol was obtained. This was used as a resist pattern coating composition.

Replacement Example 9

Here, 10 g of the polymer solution obtained in Synthesis Example 1 was put into a 100 ml single-necked eggplant flask and butyl acetate in the solvent was distilled off under a reduced pressure as much as possible. Then, 20 g of ethylene glycol monobutyl ether acetate was added, and the solvent was distilled off under a reduced pressure as much as possible. The above operation was additionally repeated three times so that a polymer solution in which the solvent was changed from butyl acetate to ethylene glycol monobutyl ether acetate was obtained. This was used as a resist pattern coating composition.

Replacement Example 10

Here, 10 g of the polymer solution obtained in Synthesis Example 1 was put into a 100 ml single-necked eggplant flask and butyl acetate in the solvent was distilled off under a reduced pressure as much as possible. Then, 20 g of 2,2,4-trimethyl-1,3-pentanediol monoisobutyrate was added, and the solvent was distilled off under a reduced pressure as much as possible. The above operation was additionally repeated three times so that a polymer solution in which the solvent was changed from butyl acetate to 2,2,4-trimethyl-1,3-pentanediol monoisobutyrate was obtained. This was used as a resist pattern coating composition.

Comparative Replacement Example 1

Here, 10 g of the polymer solution obtained in Synthesis Example 1 was put into a 100 ml single-necked eggplant flask and butyl acetate in the solvent was distilled off under a reduced pressure as much as possible. Then, 20 g of 1-methoxy-2-propanol was added, and the solvent was distilled off under a reduced pressure as much as possible. The above operation was additionally repeated three times so that a polymer solution in which the solvent was changed from butyl acetate to 1-methoxy-2-propanol was obtained.

[Preparation of Coating Composition]

The polymer solutions obtained in Synthesis Example 1 to Synthesis Example 5, Replacement Example 1 to Replacement Example 10 and Comparative Synthesis Example 1, and Comparative Replacement Example 1 were diluted to a predetermined solid content concentration with each of solvents to obtain coating compositions.

In addition, a coating solution in which polymethylsilsesquioxane (SR-13H) (commercially available from Konishi Chemical IND Co., Ltd.) was dissolved in butyl acetate was prepared.

The content ratio of the polymer shown in Table 1 does not indicate the polymer solution, but indicates a content ratio of a solid content obtained by removing a solvent from a polymer solution. The content ratio of each component is indicated by parts by mass.

In Table 1, butyl acetate, tert-butyl acetate, pentyl acetate, normal hexyl acetate, butyl butyrate, diisoamyl ether, dibutyl ether, 4-methyl-2-pentanol, cyclohexanol, ethylene glycol monobutyl ether acetate, 2,2,4-trimethyl-1,3-pentanediol monoisobutyrate and 1-methoxy-2-propanol are abbreviated as NBA, TBA, NPA, NHA, NBB, DIAE, DBE, MIBC, CyOH, EGBUA, PDBU and PGME.

TABLE 1

|  | Polymer | Solvent |
|---|---|---|
| Preparation Example 1 | Synthesis Example 1 | NBA |
| Content ratio | 5 | 100 |
| Preparation Example 2 | Synthesis Example 2 | NBA |
| Content ratio | 5 | 100 |
| Preparation Example 3 | Synthesis Example 3 | NBA |
| Content ratio | 5 | 100 |
| Preparation Example 4 | Synthesis Example 4 | NBA/MIBC |
| Content ratio | 5 | 95/5 |
| Preparation Example 5 | Synthesis Example 5 | NBA/MIBC |
| Content ratio | 5 | 90/10 |
| Preparation Example 6 | SR-13H | NBA |
| Content ratio | 5 | 100 |
| Preparation Example 7 | Replacement Example 1 | TBA |
| Content ratio | 5 | 100 |
| Preparation Example 8 | Replacement Example 2 | NPA |
| Content ratio | 5 | 100 |
| Preparation Example 9 | Replacement Example 3 | NHA |
| Content ratio | 5 | 100 |
| Preparation Example 10 | Replacement Example 4 | NBB |
| Content ratio | 5 | 100 |
| Preparation Example 11 | Replacement Example 5 | DIAE |
| Content ratio | 5 | 100 |
| Preparation Example 12 | Replacement Example 6 | DBE |
| Content ratio | 5 | 100 |
| Preparation Example 13 | Replacement Example 7 | MIBC |
| Content ratio | 5 | 100 |
| Preparation Example 14 | Replacement Example 8 | CyOH |
| Content ratio | 5 | 100 |
| Preparation Example 15 | Replacement Example 9 | EGBUA |
| Content ratio | 5 | 100 |
| Preparation Example 16 | Replacement Example 10 | PDBU |
| Content ratio | 5 | 100 |
| Comparative Preparation Example 1 | Comparative Synthesis Example 1 | NBA |
| Content ratio | 5 | 100 |
| Comparative Preparation Example 2 | Comparative Replacement Example 1 | PGME |
| Content ratio | 5 | 100 |

(NBA Solubility Evaluation of Coating Composition)

NBA solubility evaluation in which 2 g of NBA was added to 2 g of the coating compositions (coating solutions) in Preparation Examples 1 to 16 and Comparative Preparation Example 1 and the presence of turbidity in the coating compositions was checked was performed. The evaluation results are shown in the following Table 2.

TABLE 2

| Examples | Coating composition | Turbidity check (visual observation) |
|---|---|---|
| Example 1 | Preparation Example 1 | None |
| Example 2 | Preparation Example 2 | None |
| Example 3 | Preparation Example 3 | None |
| Example 4 | Preparation Example 4 | None |
| Example 5 | Preparation Example 5 | None |
| Example 6 | Preparation Example 6 | None |
| Example 7 | Preparation Example 7 | None |
| Example 8 | Preparation Example 8 | None |
| Example 9 | Preparation Example 9 | None |
| Example 10 | Preparation Example 10 | None |
| Example 11 | Preparation Example 11 | None |
| Example 12 | Preparation Example 12 | None |
| Example 13 | Preparation Example 13 | None |
| Example 14 | Preparation Example 14 | None |
| Example 15 | Preparation Example 15 | None |
| Example 16 | Preparation Example 16 | None |
| Comparative Example 1 | Comparative Preparation Example 1 | YES |

[Solubility of Photoresist in Coating Composition]
(Test for Resistance of Photoresist with Respect to Coating Composition)

A resist underlayer film forming composition (a resist underlayer film forming composition having an isocyanuric acid framework) was applied to a silicon substrate with SiON deposited thereon using a spinner, and heated at 240° C. for 60 seconds, and thereby a resist underlayer film with a film thickness of 23 nm was formed, and a negative development resist solution for ArF (product name: FAiRS-9521V10K commercially available from Fujifilm Corporation) was applied to the film using a spinner. Heating was performed on a hot plate at 110° C. for 90 seconds, and thereby a resist film with a film thickness of 85 nm was formed. The entire resist film was exposed under predetermined conditions using an exposure apparatus for ArF excimer laser (S307E commercially available from Nikon). After exposure, heating (PEB) was performed at 110° C. for 90 seconds, and the silicon substrate was cooled to room temperature on a cooling plate. After the resist film-formed substrate after PEB was developed with butyl acetate, the coating compositions of Preparation Examples 1 to 16 and Comparative Preparation Example 2 were applied thereto without spin drying, and butyl acetate used for development was replaced with the coating composition. Then, the silicon substrate was spun at 1,500 rpm for 60 seconds, the solvent in the coating composition was dried, and additionally, heating was performed at 100° C. for 60 seconds, and thereby various polysiloxane coating films of Preparation Examples 1 to 16 and Comparative Preparation Example 2 were formed on the resists.

Regarding the substrates after lamination with the coating films of Preparation Examples 1 to 16 and Comparative Preparation Example 2, butyl acetate was applied again to the entire substrate and the substrate was left for 60 seconds, and then spun at 3,000 rpm for 30 seconds, and a coating solution dissolved in butyl acetate and butyl acetate were removed, and heating was then performed at 100° C. for drying. After the coating films of Preparation Examples 1 to 16 and Comparative Preparation Example 2 were peeled off with butyl acetate, the resist film thickness was measured using an interference film thickness meter. Measurement results are shown in the following Table 3. In the following Table 3, "insoluble" indicates that the resist and the coating composition were not mixed during lamination, and the resist film thickness before lamination was maintained even after the polysiloxane coating film was removed with butyl acetate. On the other hand, in the following Table 3, "dissolved" indicates that the resist and the coating composition were mixed during lamination, and when the polysiloxane coating film was removed with butyl acetate, the resist film was also removed at the same time, and the film thickness was equal to or less than half of the resist film thickness before lamination.

TABLE 3

| Examples | Coating composition | Photoresist solubility |
|---|---|---|
| Example 17 | Preparation Example 1 | Insoluble |
| Example 18 | Preparation Example 2 | Insoluble |
| Example 19 | Preparation Example 3 | Insoluble |
| Example 20 | Preparation Example 4 | Insoluble |
| Example 21 | Preparation Example 5 | Insoluble |
| Example 22 | Preparation Example 6 | Insoluble |
| Example 23 | Preparation Example 7 | Insoluble |
| Example 24 | Preparation Example 8 | Insoluble |

TABLE 3-continued

| Examples | Coating composition | Photoresist solubility |
|---|---|---|
| Example 25 | Preparation Example 9 | Insoluble |
| Example 26 | Preparation Example 10 | Insoluble |
| Example 27 | Preparation Example 11 | Insoluble |
| Example 28 | Preparation Example 12 | Insoluble |
| Example 29 | Preparation Example 13 | Insoluble |
| Example 30 | Preparation Example 14 | Insoluble |
| Example 31 | Preparation Example 15 | Insoluble |
| Example 32 | Preparation Example 16 | Insoluble |
| Comparative Example 2 | Comparative Preparation Example 2 | Dissolved |

[Evaluation of Pattern Reverse with Coating Composition]

(Evaluation of Filling Between ArF Resist Patterns and Pattern Reverse According to Dry Etching)

A resist underlayer film forming composition (a resist underlayer film forming composition having an isocyanuric acid framework) was applied to a surface of a substrate on which SiON was deposited with a thickness of 50 nm on the silicon substrate using a spinner, heated at 205° C. for 60 seconds, and thereby a resist underlayer film with a film thickness of 23 nm was formed. A negative development resist solution for ArF (product name: FAiRS-9521V10K commercially available from Fujifilm Corporation) was applied to the coating film using a spinner. Heating was performed on a hot plate, at 110° C. for 90 seconds, and thereby a resist film with a film thickness of 85 nm was formed. The resist film was exposed under predetermined conditions using an exposure apparatus for ArF excimer laser (S307E commercially available from Nikon). After exposure was performed under optimal conditions so that patterns with a pattern line width of 65 nm and a space width of 65 nm were formed after development, heating (PEB) was performed at 110° C. for 90 seconds, the silicon substrate was cooled to room temperature on a cooling plate. The substrate after PEB was developed with butyl acetate, but during the development step, coating solutions of Preparation Examples 1, 2, 4, 5, 6, 8, 10, 11, and 13 and Comparative Preparation Example 2 were applied, and butyl acetate used for development was replaced with these coating solutions. Then, the silicon substrate was spun at 1,500 rpm for 60 seconds, the solvent in the coating solution was dried, and additionally, heating was performed at 100° C. for 60 seconds, and thereby a space part of the resist pattern was filled with various polysiloxane coating films of Preparation Examples 1, 2, 4, 5, 6, 8, 10, 11, and 13 and Comparative Preparation Example 2.

The coating films formed using the coating compositions of Preparation Examples 1, 2, 4, 5, 6, 8, 10, 11, and 13 and Comparative Preparation Example 2 were etched back by dry etching using a gas in which $CF_4$ (with a flow rate of 50 sccm) and Ar (with a flow rate of 200 sccm) were mixed, and the upper part of the resist pattern was exposed. Then, the resist pattern was removed by dry etching using a gas in which $O_2$ (with a flow rate of 10 sccm) and $N_2$ (with a flow rate of 20 sccm) were mixed, and thereby reverse patterns composed of the coating compositions of Preparation Examples 1, 2, 4, 5, 6, 8, 10, 11, and 13 and Comparative Preparation Example 2 were obtained.

The reverse pattern obtained after dry etching was observed in cross-sectional SEM images. The results are shown in FIGS. 1 to 9. The evaluation results of the pattern shape are described in the following Table 4. In the following Table 4, "Good" indicates that the reverse pattern was formed without collapse of the resist pattern. On the other hand, in the following Table 4, "Poor" indicates that the resist pattern was mixed with the coating composition and a favorable reverse pattern was not obtained.

TABLE 4

| Examples | Coating composition | Pattern shape |
|---|---|---|
| Example 33 | Preparation Example 1 | Good |
| Example 34 | Preparation Example 2 | Good |
| Example 35 | Preparation Example 4 | Good |
| Example 36 | Preparation Example 5 | Good |
| Example 37 | Preparation Example 6 | Good |
| Example 38 | Preparation Example 8 | Good |
| Example 39 | Preparation Example 10 | Good |
| Example 40 | Preparation Example 11 | Good |
| Example 41 | Preparation Example 13 | Good |
| Comparative Example 3 | Comparative Preparation Example 2 | Poor |

Evaluation of Filling Between EUV Resist Patterns and Pattern Reverse by Dry Etching)

A resist underlayer film forming composition (a resist underlayer film forming composition including a novolac resin) was applied to a silicon substrate using a spinner and heated at 240° C. for 60 seconds to form a resist underlayer film with a film thickness of 20 nm, and a negative development resist solution for EUV (commercially available from Fujifilm Corporation) was applied to the film using a spinner. Heating was performed on a hot plate and a resist film with a film thickness of 40 nm was formed. Using an EUV exposure apparatus (NXE3300 commercially available from ASML), the resist film was exposed under predetermined conditions. After the exposure in which a desired line width was set to 16 nm and a space width was set to 16 nm was performed, heating (PEB) was performed and the silicon substrate was cooled to room temperature on a cooling plate. Then, in a developing solution for negative development, the coating compositions of Preparation Examples 1, 5, and 6 were applied without performing a spin drying step during the development step, and the developing solution was replaced with the coating compositions of Preparation Examples 1, 5, and 6. Then, spin drying was performed at 1,500 rpm for 60 seconds, heating was performed at 100° C., and a space part of the resist pattern formed in the development step was filled with the coating film of Preparation Examples 1, 5, and 6.

The coating films formed using the coating solutions of Preparation Examples 1, 5, and 6 were etched back by dry etching using a gas in which $CF_4$ (with a flow rate of 50 sccm) and Ar (with a flow rate of 200 sccm) were mixed and the upper part of the resist pattern was exposed. Then, the resist pattern was removed by dry etching using a gas in which $O_2$ (with a flow rate of 10 sccm) and $N_2$ (with a flow rate of 20 sccm) were mixed and a reverse pattern was obtained.

Figure 10:
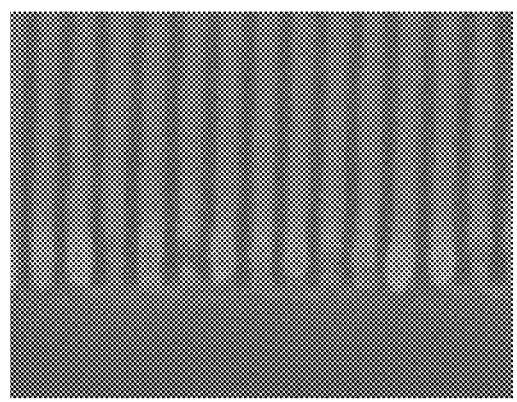
FIG. 10 shows a cross-sectional SEM image (with a magnification of 150,000) of a reverse pattern obtained in Example 42 using a coating composition of Preparation Example 1.
Figure 11:
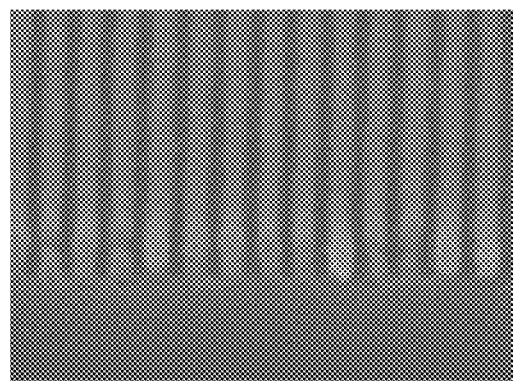
FIG. 11 shows a cross-sectional SEM image (with a magnification of 150,000) of a reverse pattern obtained in Example 43 using a coating composition of Preparation Example 5.
Figure 12:
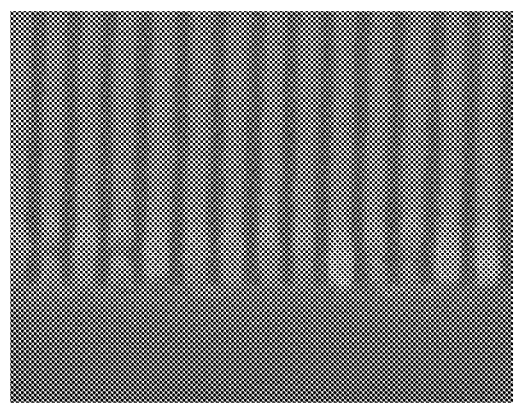
FIG. 12 shows a cross-sectional SEM image (with a magnification of 150,000) of a reverse pattern obtained in Example 44 using a coating composition of Preparation Example 6.

The reverse pattern obtained after dry etching after filling with the coating compositions of Preparation Examples 1, 5, and 6 was observed in cross-sectional SEM images. The results are shown in FIGS. 10 to 12. The results are shown in the following Table 5. The evaluation results of the pattern shape are described in the following Table 5. In the following Table 5, "Good" indicates that the reverse pattern was formed without collapse of the resist pattern. "Collapse" indicates collapse of the resist pattern. "General development" indicates that the resist pattern was developed only with a negative developing solution, and the negative developing solution was then spin-dried without filling into the pattern with the coating composition used in the present invention.

TABLE 5

| Examples | Coating composition | Pattern shape |
|---|---|---|
| Example 42 | Preparation Example 1 | Good |
| Example 43 | Preparation Example 5 | Good |
| Example 44 | Preparation Example 6 | Good |
| Comparative Example 4 | General development | Collapse |

INDUSTRIAL APPLICABILITY

There is provided a method for producing a hydrolyzable siloxane composition that can be applied to a patterned resist film in a solvent development process.

There is provided a method in which the composition can be applied to a patterned resist film and filled between resist patterns, and the pattern is reversed by gas etching using a difference in gas etching rate between the film with the coating composition formed between resist patterns and a resist film.

The invention claimed is:

1. A method for producing a composition applied to a patterned resist film, comprising:
   a step (A) of obtaining a hydrolysis condensation product by hydrolyzing and condensing a hydrolyzable silane in a non-alcoholic hydrophilic solvent; and
   a step (B) of solvent replacement in which the non-alcoholic hydrophilic solvent is replaced with a hydrophobic solvent for the hydrolysis condensation product,
   wherein the hydrophobic; solvent in step (B) is selected from the group consisting of an aliphatic ester having a carbon atom number of from 5 to 20, an aromatic ester having a carbon atom number of from 5 to 20, and a dialkyl ether having two alkyl groups having a carbon atom number of 4 or more and having a total of 8 to 20 carbon atoms.

2. The production method according to claim 1,
   wherein the hydrolyzable silane is represented by Formula (1):

   $R^1_a Si(R^2)_{4-a}$   Formula (1)

wherein in Formula (1), $R^1$ is an alkyl group, an aryl group, a halogenated alkyl group, a halogenated aryl group or an alkenyl group, or an organic group having an epoxy group, a mercapto group, an acryl group, a methacryl group or a cyano group and bonded to a silicon atom via a Si—C bond, $R^2$ is an alkoxy group, an acyloxy group, or a halogen group, and a is an integer of 0 or 1, and
      wherein a hydrolyzable silane (1-1) in which a is 0 in Formula (1) and a hydrolyzable silane (1-2) in which a is 1 in Formula (1) are included in a molar ratio (1-1):(1-2) of from 0 to 50:100 to 50 in the total amount of hydrolyzable silane.

3. The production method according to claim 1,
   wherein the non-alcoholic hydrophilic solvent used in the step (A) is an aliphatic ketone having a carbon atom number of 3 or 4.

4. The production method according to claim 1,
   wherein the non-alcoholic hydrophilic solvent used in the step (A) is acetone.

5. The production method according to claim 1,
   wherein the composition further includes an acid or a base.

6. The production method according to claim 1,
   wherein the composition further includes a surfactant.

7. The production method according to claim 1,
   wherein the composition further includes a photoacid generating agent.

8. A method for producing a semiconductor device, comprising:
   a step (1) of applying a resist composition to a substrate and forming a resist film;
   a step (2) of exposing and developing the formed resist film;
   a step (3) of applying the composition obtained by the production method according to claim 1 to a patterned resist film obtained during development or after development in the step (2), and forming a coating film between patterns; and
   a step (4) of removing the patterned resist film by etching and reversing the pattern.

9. A method for producing a semiconductor device, comprising:
   a step (1-1) of forming a resist underlayer film on a substrate, applying a resist composition to the resist underlayer film, and forming a resist film;
   a step (2) of exposing and developing the formed resist film;
   a step (3) of applying the composition obtained by the production method according to claim 1 to a patterned resist film obtained during development or after development in the step (2) and forming a coating film between patterns; and
   a step (4-1) of removing the patterned resist film and a resist underlayer film thereunder by etching and reversing the pattern.

10. A method for producing a semiconductor device, comprising:
    a step (1-2) of applying a resist composition to a substrate or a resist underlayer film formed on the substrate and forming a resist film;
    a step (2) of exposing and developing the formed resist film;
    a step (3-2) of applying the composition obtained by the production method according to claim 1 to a patterned resist film obtained during development or after development in the step (2), forming a coating film between the patterns and on an upper surface of the resist film, and then etching back the surface of the coating film and exposing an upper surface of the patterned resist film; and
    a step (4-2) of removing the patterned resist film or the patterned resist film and a resist underlayer film thereunder by etching and reversing the pattern.

11. The production method according to claim 8,
    wherein exposure is performed using an ArF laser (with a wavelength of 193 nm) or EUV (with a wavelength of 13.5 nm).

12. The production method according to claim 8, wherein the development is negative development with an organic solvent.

* * * * *